(12) United States Patent
Hashimoto et al.

(10) Patent No.: US 12,216,406 B2
(45) Date of Patent: Feb. 4, 2025

(54) COATING METHOD AND COATING APPARATUS

(71) Applicant: Tokyo Electron Limited, Tokyo (JP)

(72) Inventors: Yusaku Hashimoto, Kumamoto (JP);
Masatoshi Kawakita, Kumamoto (JP);
Kosuke Yoshihara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/623,392

(22) PCT Filed: Jun. 25, 2020

(86) PCT No.: PCT/JP2020/024990
§ 371 (c)(1),
(2) Date: Dec. 28, 2021

(87) PCT Pub. No.: WO2021/002269
PCT Pub. Date: Jan. 7, 2021

(65) Prior Publication Data
US 2022/0371047 A1 Nov. 24, 2022

(30) Foreign Application Priority Data

Jul. 4, 2019 (JP) .................................. 2019-125439

(51) Int. Cl.
*B05D 1/00* (2006.01)
*B05B 12/04* (2006.01)
(Continued)

(52) U.S. Cl.
CPC .............. *G03F 7/162* (2013.01); *B05B 12/04* (2013.01); *B05B 13/0228* (2013.01);
(Continued)

(58) Field of Classification Search
CPC ................................ B05D 1/005; G03F 7/162
See application file for complete search history.

(56) References Cited

U.S. PATENT DOCUMENTS 6,200,633 B1 * 3/2001 Kitano ................. G05D 11/132
118/52
2017/0255101 A1 9/2017 Wang
2018/0252999 A1 * 9/2018 Stachowiak ............ G03F 7/027

FOREIGN PATENT DOCUMENTS

| CN | 110537245 A | 12/2019 |
| JP | H10-272407 A | 10/1998 |

(Continued)

OTHER PUBLICATIONS

Modeling Surface Tension of Concentrated and Mixed-Solvent Electrolyte Systems, Ind. Eng. Chem. Res. 2011, 50, 4086-4098.*

(Continued)

*Primary Examiner* — James M Mellott
(74) *Attorney, Agent, or Firm* — Posz Law Group, PLC

(57) ABSTRACT

A coating method of supplying a treatment solution to a substrate and coating the substrate with the treatment solution by a spin coating method. The method includes mixing a solvent for the treatment solution lower in surface tension than the treatment solution into the treatment solution concurrently with a start of supply of the treatment solution or later than the start of the supply of the treatment solution, and then supplying the treatment solution to the substrate.

15 Claims, 4 Drawing Sheets

(51) Int. Cl.
*B05B 13/02* (2006.01)
*B05D 1/40* (2006.01)
*G03F 7/16* (2006.01)

(52) U.S. Cl.
CPC ............... *B05D 1/005* (2013.01); *B05D 1/40* (2013.01); *B05D 2401/10* (2013.01)

(56) References Cited

FOREIGN PATENT DOCUMENTS

| | | | |
|---|---|---|---|
| JP | 2010207788 A | * | 9/2010 |
| JP | 2019-46850 A | | 3/2019 |
| TW | I392545 B | | 4/2013 |
| TW | 2019-19775 A | | 6/2019 |
| WO | 2001/84621 A1 | | 11/2001 |

OTHER PUBLICATIONS

International Search Report mailed Aug. 11, 2020 issued in corresponding international patent application No. PCT/JP2020/024990 (and English translation thereof).

* cited by examiner

|  | Resist dispense volume [g] | | | | | | |
|---|---|---|---|---|---|---|---|
|  | 0.15 | 0.2 | ... | 0.35 | ... | 0.4 | 0.45 |
| Only resist | NG | ←------------------------------------→ | | | | NG | OK |
| Mixed with 20% of IPA | NG | ←--------------------------------→ | | | | NG | OK | OK |
| Mixed with 20% of OK73 | NG | ←--------------------------------→ | | | | NG | OK | OK |
| Mixed with 20% of PGMEA | NG | ←----------→ | NG | OK | ←------------------→ | | OK |
| Mixed with 20% of MIBC | NG | OK | ←--------------------------------------------------→ | | | | OK |

COATING METHOD AND COATING APPARATUS

This application is a U.S. national stage application of International Application No. PCT/JP2020/024990 filed on Jun. 25, 2020, based upon and claims the benefit of priority of the prior Japanese Patent Application No. 2019-125439 filed on Jul. 4, 2019, the entire contents of which are incorporated herein by reference.

TECHNICAL FIELD

This disclosure relates to a coating method and a coating apparatus.

BACKGROUND ART

Patent Document 1 discloses a resist coating method including: a solvent supply step of supplying a solvent onto an almost center of an almost standing-still substrate; a first step of rotating the substrate at a first rotation speed while supplying a resist solution onto the solvent on the almost center of the substrate after the solvent supply step; a second step of rotating the substrate at a second rotation speed lower than the first rotation speed after the first step; and a third step of rotating the substrate at a third rotation speed lower than the first rotation speed and higher than the second rotation speed after the second step. Patent Document 1 also discloses execution of pre-wet on the substrate with a solvent such as a thinner or the like before the resist solution coating in order to achieve the saving of the resist.

PRIOR ART DOCUMENT

Patent Document

Patent Document 1: Japanese Laid-open Patent Publication No. 2010-207788

DISCLOSURE OF THE INVENTION

Problems to be Solved by the Invention

A technique according to this disclosure suppresses the required volume of a treatment solution when coating the substrate with each kind of treatment solution including a resist solution to form a coating film.

Means for Solving the Problems

An aspect of this disclosure is a coating method of supplying a treatment solution to a substrate and coating the substrate with the treatment solution by a spin coating method, including mixing a solvent for the treatment solution lower in surface tension than the treatment solution into the treatment solution concurrently with a start of supply of the treatment solution or later than the start of the supply of the treatment solution, and then supplying the treatment solution to the substrate.

Effect of the Invention

According to this disclosure, it is possible to suppress the required volume of a treatment solution when coating the substrate with each kind of treatment solution including a resist solution to form a coating film.

EMBODIMENTS FOR CARRYING OUT THE INVENTION

Figure 1:
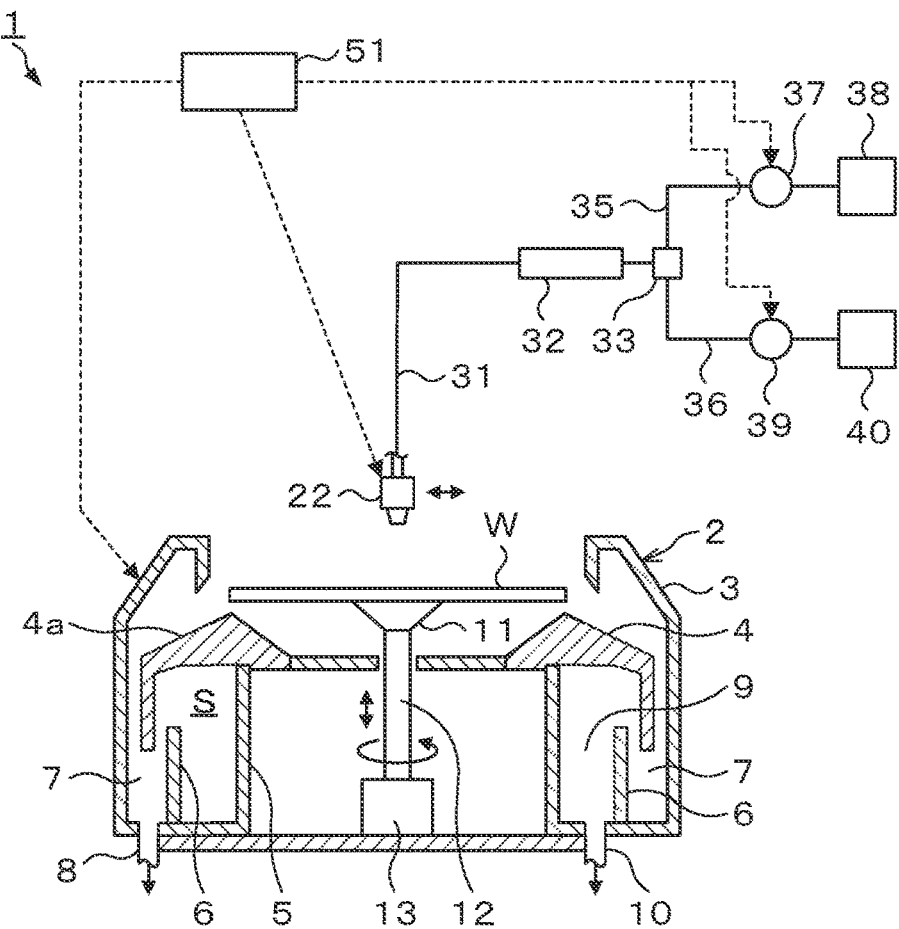
FIG. 1 is an explanatory view of a side cross-section schematically illustrating the outline of a configuration of a coating apparatus according to an embodiment.

In a photolithography step of a semiconductor device manufacturing process, conventionally, a resist solution for forming a pattern on a substrate, for example, a semiconductor wafer (hereinafter, referred to as a "wafer") is applied onto the wafer by the spin coating method to form a resist film on the surface of the wafer. In this case, in order to suppress the consumption of the expensive resist solution to save the resist, a pre-wet treatment of diffusing a thinner being a solvent for the resist solution over the entire surface of the wafer is performed before the supply of the resist solution (Patent Document 1).

However, when performing the pre-wet treatment, there is a case in which some kinds of solvent may have a problem in coating performance of coating the entire surface of the wafer. In this case, it is required to supply a large volume of solvent or to supply more resist solution. In more detail, the coating treatment using a resist solution having a high surface tension or a solvent having a low surface tension encounters a problem in the coatability of the resist solution and thus requires more resist solution in order to form a resist film having a film thickness and uniformity satisfying the requirement.

This disclosure makes the required volume when applying each kind of treatment solution including the resist solution smaller than that in the prior art irrespective of the coating performance of the solvent, and suppresses the required volume of the treatment solution to be smaller than that in the prior art when applying each kind of treatment solution to the substrate to form a coating film.

Hereinafter, a configuration of a coating apparatus and a coating method according to the embodiment will be explained referring to the drawings. Note that the same codes are given to components having substantially the same functions and configurations in the description to omit duplicated explanation.

<Resist Coating Apparatus>

Figure 2:
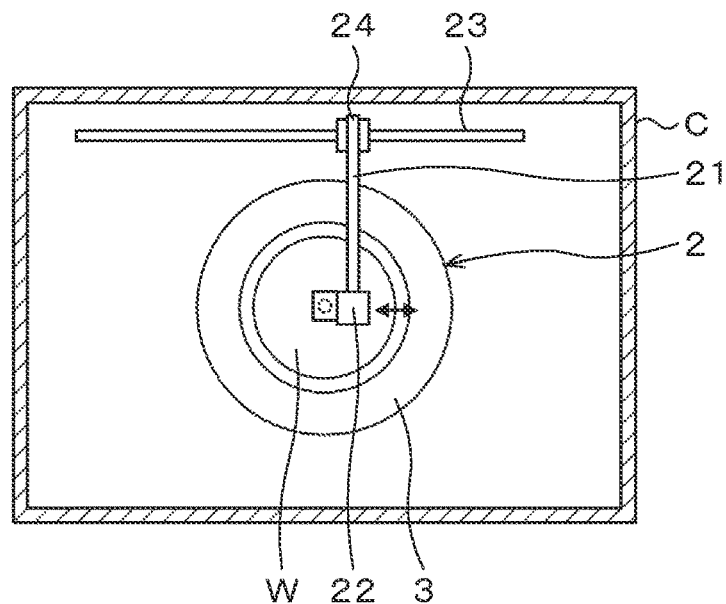
FIG. 2 is an explanatory view of a plane cross-section schematically illustrating the outline of the configuration of the coating apparatus in FIG. 1.

FIG. 1 and FIG. 2 illustrate the outline of a configuration of a resist coating apparatus 1 as a coating apparatus according to the embodiment, and the resist coating apparatus 1 has a cup body 2 in a casing C. In the cup body 2, a spin chuck 11 as a rotating and holding member for horizontally holding a substrate such as a wafer W by sucking a central portion on the rear surface side of the wafer W is provided to be able to rise and lower and rotate around the vertical axis. The spin chuck 11 is connected to a rotation drive mechanism 13 via a shaft 12, and the spin chuck 11 is configured to be able to rise and lower and rotate by the rotation drive mechanism 13, while holding the wafer W.

The cup body 2 has a shape opening on the upper side so as to surround the wafer W held on the spin chuck 11, and has an outer cup 3 and an inner cup 4. An upper end portion on a side peripheral surface of the outer cup 3 is inclined inward, and its tip end portion is folded downward. The inner cup 4 is located inside the outer cup 3, and has an inclined portion 4a inclined toward the outer cup 3. The inner cup 4 is supported by a cylindrical support 5. Thus, a cylindrical annular space S is formed on the lower side of the inner cup 4.

In the space S, an annular partition plate 6 is formed. A space between the partition plate 6 and the outer cup 3 forms a solution receiver 7. To a bottom portion of the solution receiver 7, a drain pipe 8 is connected. The space S between the partition plate 6 and the support 5 forms an exhaust space 9. To a bottom portion of the exhaust space 9, an exhaust pipe 10 is connected. Accordingly, a solution drop and mist of the treatment solution and the like scattering due to rotation of the wafer W flow from the solution receiver 7 to the drain pipe 8 and drained. On the other hand, vapor and the like flow from the exhaust space 9 to the exhaust pipe 10 and exhausted.

Above the spin chuck 11, a supply nozzle 22 supported on a nozzle arm 21 illustrated in FIG. 2 can move to and stop at any position above the spin chuck 11. More specifically, the nozzle arm 21 is movable on a rail 23 provided in the casing C by a drive mechanism 24. The supply nozzle 22 can also rise and lower.

The supply nozzle 22 is connected to one end of a supply path 31 such as a pipe, and the other end side of the supply path 31 is branched into a resist solution-system supply path 35 and a solvent-system supply path 36 via a line mixer 32 and a mixing block 33. To the resist solution-system supply path 35, a resist solution supply source 38 is connected via a bellows pump 37. On the other hand, to the solvent-system supply path 36, a solvent supply source 40 is connected via a bellows pump 39. The line mixer 32 is a mixing means for mixing the resist solution and the solvent, and is configured such that a plurality of baffle plates are arranged, for example, in a length direction of a cylindrical pipe though not illustrated. Theses baffle plates are formed by twisting plate-shaped bodies, for example, having substantially the same width as the inner diameter of the cylindrical pipe, by 90 degrees rightward or leftward in the length direction. As a matter of course, the mixing means is not limited to the line mixer 32, but another mechanism which can mix at least two solutions can also be employed.

The bellows pumps 37, 39 function as solution transfer means which can regulate the flow rate by changing a dispense stroke. The flow rate adjustment, dispense start, and dispense stop timing by the bellows pumps 37, 39 are controlled by a control device 51.

The control device 51 is a computer including, for example, a CPU, a memory and so on, and has a program storage (not illustrated). The program storage stores a program for controlling the coating treatment on the wafer W in the resist coating apparatus 1. The control device 51 is configured, for example, to control the start and stop of the rotation drive and the rotation speed of the rotation drive mechanism 13, the vertical movement of the spin chuck 11, and the raising and lowering operation and the movement and stop in the horizontal direction of the supply nozzle 22. Further, the program in the program storage may be the one recorded in a computer-readable storage medium and installed from the storage medium to the control device 51.

The resist coating apparatus 1 according to the embodiment is configured as explained above, and the use of the resist coating apparatus 1 makes it possible to dispense the resist solution from the resist solution supply source 38 and the solvent from the solvent supply source 40 at respective desired timings, desired flow rates, and a desired mixing ratio, from the supply nozzle 22 onto the wafer W on the spin chuck 11. Accordingly, the rotation of the spin chuck 11 makes it possible to form a resist film on the wafer W by coating by the spin coating method.

Next, a coating method according to the embodiment using the resist coating apparatus 1 will be explained as an example. The coating apparatus used in the coating method according to the embodiment is not limited to the resist coating apparatus 1 having the above-explained configuration.

<Coating Methods>

First, before the explanation of the coating method according to the embodiment, the results of experiments carried out by the inventors for some coating methods will be explained. These experiments are examples using a resist solution as the treatment solution and using a solvent (RRC) for the resist solution used for a pre-wet treatment as a solvent.

Figure 3:
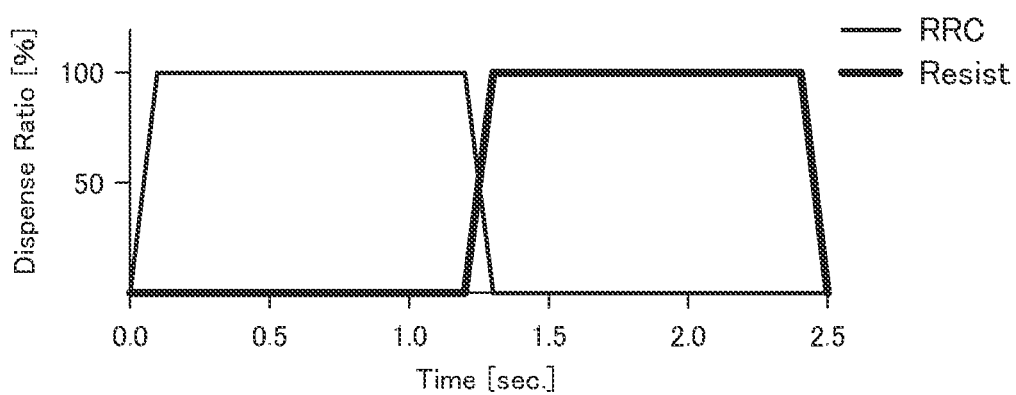
FIG. 3 is a graph illustrating changes over time in dispense rates of a resist solution and a solvent in a conventional pre-wet treatment type coating method.

The example illustrated in FIG. 3 illustrates a general pre-wet treatment. More specifically, FIG. 3 illustrates a timing chart in which only the solvent is supplied until 1.2 seconds from start of the coating treatment, then the supply of the solvent is stopped and only the resist solution is supplied, and the supply of the resist solution is stopped at a time point of 2.4 seconds from the start (time in FIG. 3 is a time point of 0.0). In this chart, the vertical axis indicates proportions of the resist solution and the solvent supplied from the respective bellows pumps 37, 39 to the maximum dispense rate (for example, 0.41 ml/sec). Further, the rotation speed of the wafer at that time is the publicly-known rotation speed according to the viscosity of the resist solution, for example, the rotation speed selected in a range of 500 to 4000 rpm.

Figure 4:
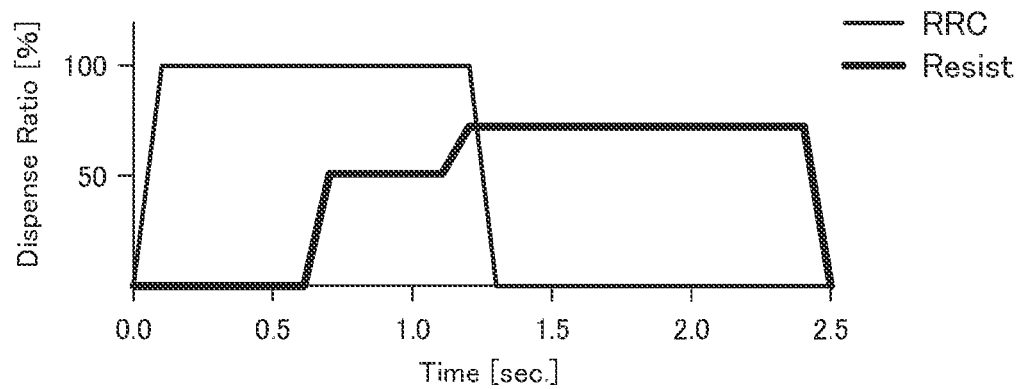
FIG. 4 is a graph illustrating changes over time in dispense and mixing rates of the resist solution and the solvent in another type coating method.

In an example illustrated in FIG. 4, the solvent is supplied at a flow rate of 100% of the maximum dispense rate until 1.2 seconds from the start as in the example of FIG. 3. On the other hand, the resist solution is started to be supplied slightly later than the start time of supply of the solvent, for example, at a time point of 0.6 seconds from the start, and mixed. Then, in the example, the resist solution is continuously mixed at a flow rate of 50% of the maximum dispense rate and dispensed from the supply nozzle 22 until 1.1 seconds from the start, then the flow rate of the resist solution is increased and the resist solution is supplied to the wafer at a flow rate of 70% of the maximum dispense rate, and the supply of the resist solution is stopped at a time point of 2.4 seconds from the start.

Figure 5:
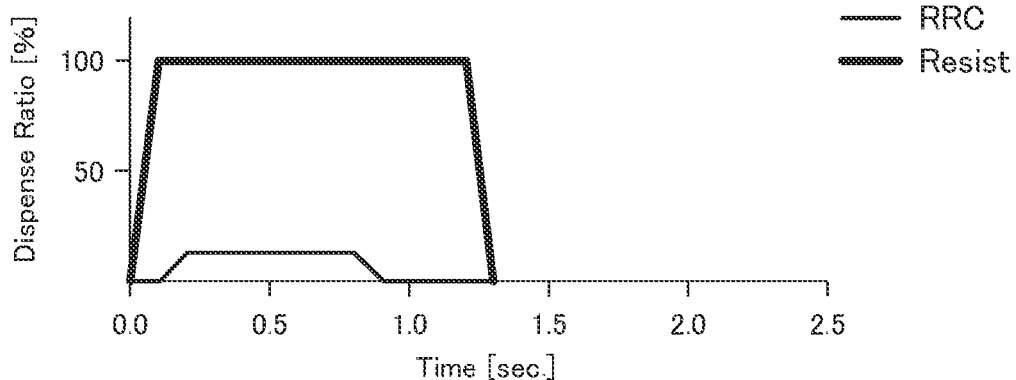
FIG. 5 is a graph illustrating a change over time in mixing rate of the resist solution and the solvent in a coating method according to an embodiment.

The coating method according to the embodiment is a coating method illustrated in FIG. 5. More specifically, after performing the general pre-wet treatment, the resist solution is supplied to the wafer W at a flow rate of 100% of the maximum dispense rate until 1.2 seconds from start, and then the supply is stopped. On the other hand, the mixing of the solvent is started at a flow rate of 10% of the maximum dispense rate after 0.1 seconds from the start, and the mixing is stopped after 0.8 seconds from the start.

The evaluations made for the resist films formed by the above three coating methods revealed that the case of a recipe illustrated in FIG. 5 according to the embodiment can obtain a predetermined coating performance, namely, can completely coat the surface of the wafer with a smallest resist solution volume. According to the experiments by the inventors, the resist solution was able to be saved by 20 to 50% than by the conventional coating method employing the pre-wet treatment illustrated in FIG. 3.

In the findings by the inventors, even after the pre-wet treatment is performed, there is a point to be improved in the coatability in the case of forming a film by applying the resist solution having high surface tension by the spin coating method and, as a result, a larger volume of resist solution is required. However, in the embodiment illustrated in FIG. 5, by mixing a small volume of solvent lower in surface tension than the resist solution into the resist solution after the dispense of the resist solution, the diffusibility of the resist solution improves. Once the resist solution is diffused over the entire surface of the wafer W, the solvent becomes unnecessary thereafter, and therefore there is no problem in diffusibility and coatability even if the supply (mixing) of the solvent is stopped. Accordingly, in applying the resist solution to the wafer to form a coating film, the required volume of the resist solution can be suppressed. The coatability can also be improved.

As for the timing to mix the solvent after the dispense of the resist solution, the mixing of the solvent may be started concurrently with the dispense of the resist solution. Note that the solvent is unnecessary after the resist solution is diffused over the entire surface of the wafer W as explained above, and therefore the mixing of the solvent may be stopped during the supply of the resist solution. For example, ½ to ⅔ of the dispense time of the resist solution is enough for the mixing time of the solvent. Besides, the mixing proportion (volume) of the solvent is 3 to 50% to the resist solution and more preferably 3 to 20% from the findings of the inventors.

Besides, the viscosity of the applicable resist solution is 1 cP to 100 cP, and a resist solution of 3 cP to 100 cP can realize more conspicuous effect.

As a matter of course, this disclosure is applicable not only to the resist solution but also to other treatment solution and a solvent for the treatment solution. The technique of this disclosure can be applied, for example, also in forming an SOC film, to offer the above-explained effect of saving the treatment solution.

Figures 6, 7:
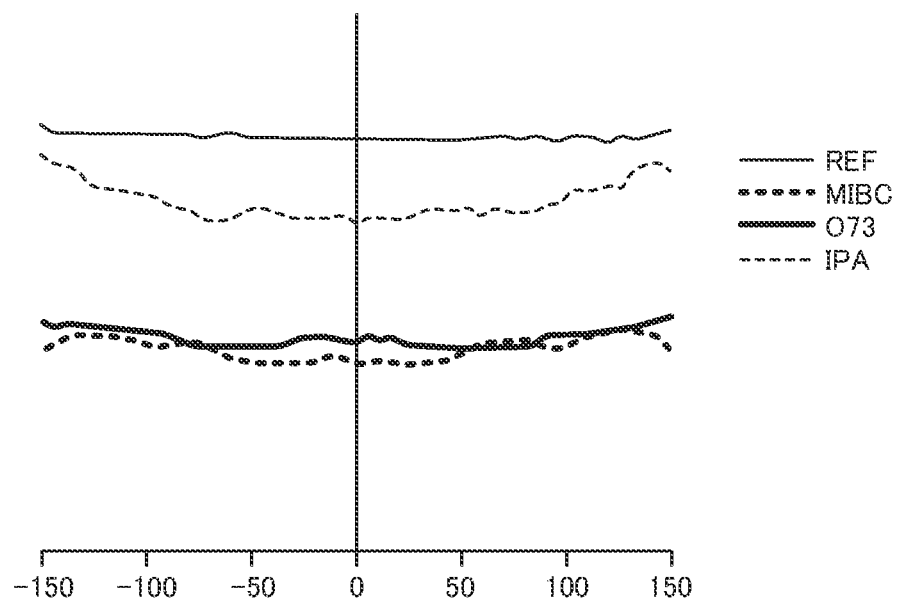
FIG. 6 is an explanatory view illustrating a profile of a film thickness when the kind of the solvent is changed in the coating method according to the embodiment.
FIG. 7 is a table listing a resist saving property when the kind of the solvent is changed in the coating method according to the embodiment.

Next, the result of carrying out the above coating method on kinds of the solvent for the resist solution will be explained. First, profiles of the film thickness are indicated in FIG. 6. In FIG. 6, the horizontal axis indicates the position of the wafer, and the vertical axis indicates the film thickness, indicating the case of REF being resist solution, MIBC (methyl isobutyl carbinol), OK73 (propylene glycol monomethyl ether, PGME), and IPA (isopropyl alcohol). Note that REF is the case where the pre-wet treatment was performed and then a film was formed by coating only by supplying the resist solution. The other solvents each indicate the case where the resist solution was diluted by 20% and a film was formed by coating by using the recipe illustrated in FIG. 5.

According to this result, in the case of MIBC, OK73, the film thickness is smaller by about 20% as a whole but is adequate, because it is a result of diluting by 20%. However, the resist solution can be saved by 20% according to the dilution. For the profile of the film thickness, it is found that the film thickness almost flat is formed over the entire surface of the wafer. Accordingly, it is found that it is possible to secure a required film thickness and form a resist film excellent in coatability and uniform in film thickness.

On the other hand, in the case of IPA, a film thickness almost the same as that in the case of only the resist solution can be obtained at the peripheral portion though there is a slight dent at a central portion. This is considered to be because IPA is high in volatility and thus gradually evaporates during the diffusion of the resist and IPA almost disappears when the resist solution reaches the outer peripheral portion. IPA is preferable to be lower in volatility but anyway has no problem in coatability and otters a resist saving effect. From this viewpoint, IPA or a solvent lower in volatility than IPA is preferable as a solvent.

As another solvent usable in the technique according to this disclosure, PGMEA (propylene glycol monomethyl ether acetate) can also be used.

The predetermined evaluations of the resist coating films formed when mixing these solvents by 20% in the resist solution and performing the coating method illustrated in FIG. 5, namely, the required dispense volumes (g) of the resist solution when satisfying the possibility of completely coating the surface of the wafer are listed in the table in FIG. 7.

According to this table, in the case of only the resist solution, 0.45 g was required, whereas in the case of IPA, OK73, 0.4 g was used to be able to form the resist film satisfying the predetermined evaluation. Besides, in the case of PGMEA, further saving of the resist was able to be achieved, and 0.35 g was used to be able to be satisfy the predetermined evaluation. It was found that in the case of MIBC, 0.2 g was used to be able to form a resist film satisfying the predetermined evaluation. Accordingly, it is found that MIBC is the best from the viewpoint of the saving of the resist.

Figure 8:
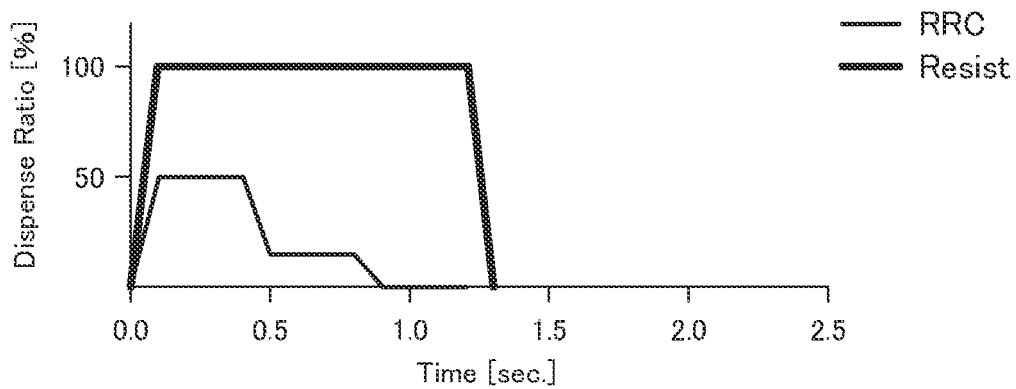
FIG. 8 is a graph illustrating a change over time in mixing rate of the resist solution and the solvent in a coating method according to another embodiment.
Figure 9:
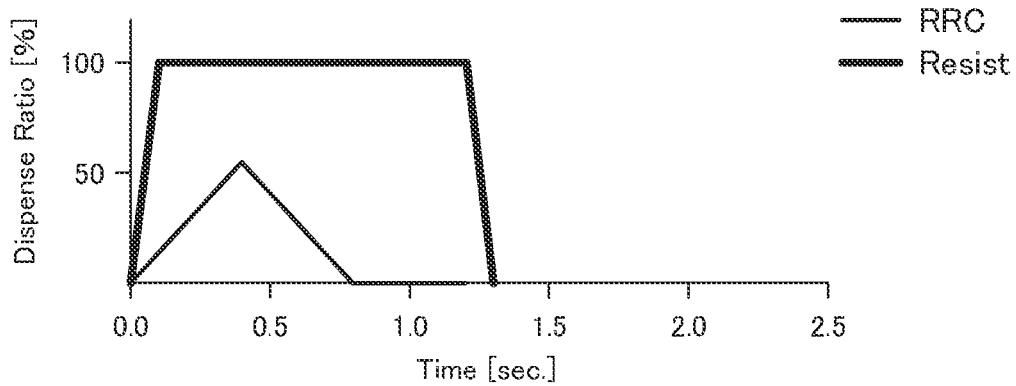
FIG. 9 is a graph illustrating a change over time in mixing rate of the resist solution and the solvent in a coating method according to another embodiment.
Figure 10:
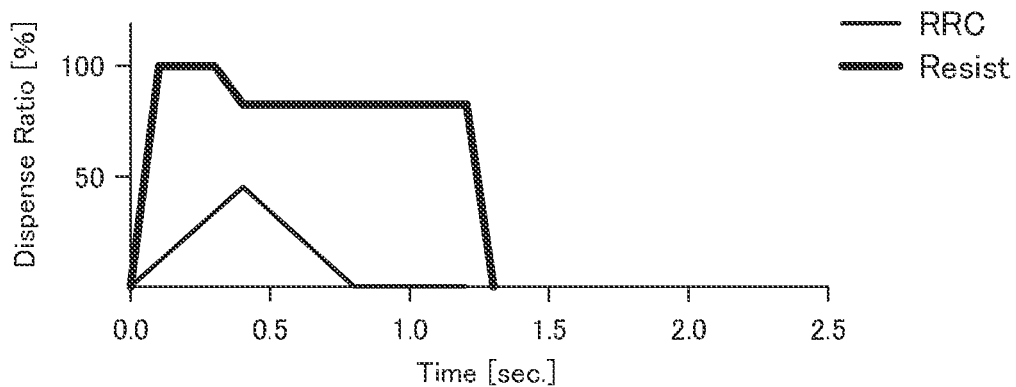
FIG. 10 is a graph illustrating a change over time in mixing rate of the resist solution and the solvent in a coating method according to another embodiment.

Other than the coating recipe illustrated in FIG. 5, coating recipes illustrated in FIG. 8 to FIG. 10 can also be proposed. More specifically, the example illustrated in FIG. 5 is the one in which the solvent is started to be mixed 0.1 seconds later than the dispense of the resist solution, then the solvent is continued to be mixed at a fixed flow rate, and the supply (mixing) of the solvent is stopped after 0.8 seconds from the start of the dispense of the resist solution.

In contrast to the above, the example in FIG. 8 is an example in which the mixing of the solvent is started concurrently with the start of the supply of the resist, the flow rate of the solvent is reduced from 50% to 15% after 0.4 seconds from the start, and the mixing of the solvent is stopped after 0.8 seconds from the start. In this coating method, the solvent is mixed into the resist solution, for example, at a rate of about 50% of the resist solution at the start time of dispense of the resist solution to lower the surface tension of the resist solution, and then the mixing proportion of the solvent is reduced. This can lower the surface tension of the resist solution from the start of diffusion of the resist solution over the wafer to enhance the diffusibility to improve the coatability, thereby realizing the saving of the resist solution.

The example in FIG. 9 is an example in which the surface tension of the resist solution is also lowered from the start of diffusion of the resist solution over the wafer to enhance the diffusibility from the beginning, and in which the mixing proportion of the solvent is gradually increased to reach the peak after 0.4 seconds from the start, then the mixing proportion is gradually decreased, and the mixing of the solvent is stopped after 0.7 seconds from the start. This example can also improve the coatability of the resist solution and form the resist film with a required film thickness on the wafer by coating with less resist solution than that in the conventional coating method only by the pre-wet treatment.

The example illustrated in FIG. 10 is an example in which more resist solution is supplied at the initial stage of staring the supply of the resist solution, for example, until 0.3 seconds from the start as compared with the example in FIG. 9, and then a fixed flow rate of the resist solution is continuously supplied as in FIG. 9. According to this example, more resist solution (as a result, the mixing proportion of the solvent is lower than that in the example in FIG. 9) can be supplied at the initial stage of diffusing the resist solution to improve the coatability of the resist solution. In any case, a resist film can be formed on the wafer by coating with less resist solution than that in the conventional coating method only by the pre-wet treatment.

As is found from the examples illustrated in FIG. 8 to FIG. 10, the mixing proportion of the solvent to the resist solution may be lowered from the intermediate time point until the end in a period of mixing the solvent into the resist solution.

In the technique according to this disclosure, during the supply of the treatment solution, for example, the resist solution to the substrate, the solvent lower in surface tension than the treatment solution is mixed during the supply of the treatment solution (also including concurrently with the start of supply), and the treatment solution itself is mixed while being continuously supplied. In other words, the treatment solution is mixed while being not intermittently but continuously supplied, whereby it becomes possible to realize the saving of the treatment solution and form a predetermined film while improving the coatability.

The solvent is mixed to improve the coatability on the substrate, but the intended purpose is to form a predetermined coating film of the treatment solution on the substrate, and therefore an intended predetermined film of the treatment solution, for example, a predetermined resist film needs to be formed on the substrate at the completion of the coating. Accordingly, the mixing of the solvent needs to be performed before the stop of the supply of the treatment solution itself and needs to be completed. To this end, it can be exemplified that the mixing may be performed mostly in the first half of the supply time as illustrated in FIG. 8 to FIG. 9, or the mixing may be performed from the first half to the middle and, in any case, the time zone when the solvent is not mixed is secured in the second half of the supply time of the treatment solution, for example, from a lapse of ½ to ⅔ of the supply time to the stop of the supply of the treatment solution. This makes it possible to form an intended film of the treatment solution in the second half while realizing the saving of the treatment solution by mixing the solvent in the first half of the supply time.

The embodiments disclosed herein are examples in all respects and should not be considered to be restrictive. Various omissions, substitutions and changes may be made in the embodiments without departing from the scope and spirit of the attached claims.

EXPLANATION OF CODES 1 resist coating apparatus
2 cup body
3 outer cup
4 inner cup
6 partition plate
7 solution receiver
8 drain pipe
9 exhaust space
10 exhaust pipe
11 spin chuck
12 shaft
13 rotation drive mechanism
21 nozzle arm
22 supply nozzle
23 rail
31 supply path
32 line mixer
33 mixing block
35 resist solution-system supply path
36 solvent-system supply path
37, 39 bellows pump
38 resist solution supply source
40 solvent supply source
51 control device
C casing
S space
W wafer

What is claimed is:

1. A coating method of supplying a treatment solution to a substrate and coating the substrate with the treatment solution by a spin coating method, the coating method comprising
    after a pre-wet treatment of the substrate, mixing a solvent for the treatment solution lower in surface tension than the treatment solution into the treatment solution concurrently with a start of supply of the treatment solution or later than the start of the supply of the treatment solution, and then supplying the treatment solution having the solvent mixed therein to the substrate having the pre-wet treatment; and
    ending the mixing of the solvent into the treatment solution before a stop of the supplying of the treatment solution to the substrate while continuing the supplying of the treatment solution without having the solvent mixed therein to the substrate, and continuing the supplying of the treatment solution without the solvent to the substrate after the end of the mixing to form a resist film on the substrate, wherein
    a mixing time of the solvent into the treatment solution is ½ to ⅔ of a supply time of the treatment solution.

2. The coating method according to claim 1, wherein
    a mixing proportion of the solvent to the treatment solution is decreased from an intermediate time point until the end in a period of mixing the solvent into the coating solution.

3. The coating method according to claim 1, wherein
    the treatment solution is a resist solution having a viscosity of 3 cP to 100 cP.

4. The coating method according to claim 1, wherein
    the solvent is IPA or a solvent lower in volatility than IPA.

5. The coating method according to claim 1, wherein the solvent is PGMEA or MIBC.

6. A coating method of supplying a treatment solution to a substrate and coating the substrate with the treatment solution by a spin coating method, the coating method comprising
after a pre-wet treatment of the substrate, mixing a solvent for the treatment solution lower in surface tension than the treatment solution into the treatment solution concurrently with a start of supply of the treatment solution or later than the start of the supply of the treatment solution, and then supplying the treatment solution having the solvent mixed therein to the substrate having the pre-wet treatment; and
ending the mixing of the solvent into the treatment solution before a stop of the supplying of the treatment solution to the substrate while continuing the supplying of the treatment solution without having the solvent mixed therein to the substrate, and continuing the supplying of the treatment solution without the solvent to the substrate after the end of the mixing to form a resist film on the substrate, wherein
a mixing time of the solvent into the treatment solution is ½ to ⅔ of a supply time of the treatment solution, and
a mixing proportion of the solvent to the treatment solution is 3 to 50% of the treatment solution.

7. The coating method according to claim 6, wherein the treatment solution is a resist solution having a viscosity of 3 cP to 100 cP.

8. The coating method according to claim 6, wherein the solvent is IPA or a solvent lower in volatility than IPA.

9. The coating method according to claim 6, wherein the solvent is PGMEA or MIBC.

10. A coating method of supplying a treatment solution to a substrate and coating the substrate with the treatment solution by a spin coating method, the coating method comprising
after a pre-wet treatment of the substrate, mixing a solvent for the treatment solution lower in surface tension than the treatment solution into the treatment solution concurrently with a start of supply of the treatment solution or later than the start of the supply of the treatment solution, and then supplying the treatment solution having the solvent mixed therein to the substrate having the pre-wet treatment; and
ending the mixing of the solvent into the treatment solution before a stop of the supplying of the treatment solution to the substrate while continuing the supplying of the treatment solution without having the solvent mixed therein to the substrate, and continuing the supplying of the treatment solution without the solvent to the substrate after the end of the mixing to form a resist film on the substrate, wherein
a mixing rate of the solvent to the treatment solution is changed over time to be lowered from an intermediate time point of a period of the mixing of the solvent into the treatment solution until the ending of the mixing.

11. The coating method according to claim 10, wherein a mixing time of the solvent into the treatment solution is ½ to ⅔ of a supply time of the treatment solution.

12. The coating method according to claim 10, wherein a mixing proportion of the solvent to the treatment solution is 3 to 50% of the treatment solution.

13. The coating method according to claim 10, wherein the treatment solution is a resist solution having a viscosity of 3 cP to 100 cP.

14. The coating method according to claim 10, wherein the solvent is IPA or a solvent lower in volatility than IPA.

15. The coating method according to claim 10, wherein the solvent is PGMEA or MIBC.

* * * * *